(12) United States Patent
Wang et al.

(10) Patent No.: US 11,150,638 B2
(45) Date of Patent: Oct. 19, 2021

(54) MODEL PROCESSING METHOD AND APPARATUS, AND MACHINE-READABLE MEDIUM

(71) Applicant: Siemens Aktiengesellschaft, Munich (DE)

(72) Inventors: Qi Wang, Wuhan (CN); Yong Yuan, Beijing (CN); Ming Kai Dong, Beijing (CN)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 601 days.

(21) Appl. No.: 15/823,944

(22) Filed: Nov. 28, 2017

(65) Prior Publication Data

US 2018/0150068 A1 May 31, 2018

(30) Foreign Application Priority Data

Nov. 30, 2016 (CN) .......................... 201611089542.6

(51) Int. Cl.
*G05B 19/418* (2006.01)
*G06F 30/20* (2020.01)

(52) U.S. Cl.
CPC ....... *G05B 19/41885* (2013.01); *G06F 30/20* (2020.01)

(58) Field of Classification Search
CPC .... G05B 19/41885; G06F 30/20; Y02P 90/26
USPC ........................................................ 703/2
See application file for complete search history.

(56) References Cited

U.S. PATENT DOCUMENTS

| 8,402,018 | B2 * | 3/2013 | Lee | G06F 16/3344 |
| | | | | 707/723 |
| 2013/0054506 | A1 * | 2/2013 | Hubauer | G05B 13/0265 |
| | | | | 706/47 |
| 2016/0092820 | A1 * | 3/2016 | Ebel | G05B 17/02 |
| | | | | 705/7.41 |
| 2017/0212949 | A1 * | 7/2017 | Bajaj | G06F 16/48 |
| 2018/0222459 | A1 * | 8/2018 | Kelly | B60W 30/18109 |

OTHER PUBLICATIONS

Zhang, Qing-Hua, et al. "Concurrent fault diagnosis for rotating machinery based on vibration sensors." International Journal of Distributed Sensor Networks 9.4 (2013): 472675. pp. 1-10 (Year: 2013).*
Bai, Jing, Jan Pedersen, and Mao Yang. "Web-scale semantic ranking." Proceedings of the 2014 SIRIP (2014). pp. 1-4. (Year: 2014).*

(Continued)

*Primary Examiner* — Kamini S Shah
*Assistant Examiner* — John E Johansen
(74) *Attorney, Agent, or Firm* — Harness, Dickey & Pierce, P.L.C.

(57) ABSTRACT

Provided are a model processing method and apparatus, and a machine-readable medium, for evaluating a semantic model to be evaluated of a target production system. In an embodiment, the method includes: acquiring feature information for describing a feature of a reference semantic model of at least one other production system; evaluating, on the basis of the feature information acquired, precision of the semantic model to be evaluated. The solution provided in an embodiment of the present invention realizes evaluation of the precision of a semantic model.

8 Claims, 11 Drawing Sheets

(56) References Cited

OTHER PUBLICATIONS

Puttonen Juha et al: "Semantics-Based Composition of Factory Automation Processes Encapsulated by Web Services"; IEEE Transactions on Industrial Informatics, IEEE Service Center, New York, NY, US, Vo l . 9, No. 4, pp. 2349-2359, XP011530574, ISSN: 1551-3203, DOI: 10.1109/TII.2012.2220554; 2013.

* cited by examiner

1A

1B

MODEL PROCESSING METHOD AND APPARATUS, AND MACHINE-READABLE MEDIUM

PRIORITY STATEMENT

The present application hereby claims priority under 35 U.S.C. § 119 to Chinese patent application number CN 201611089542.6 filed Nov. 30, 2016, the entire contents of which are hereby incorporated herein by reference.

FIELD

At least one embodiment of the present invention generally relates to the technical field of industrial automation, in particular to a model processing method and/or apparatus, and/or a machine-readable medium.

BACKGROUND

In the field of industrial automation, semantic models can be used to describe the various components in a production system (e.g. a factory), attributes of the various components, data generated by the various components during production, and associations between the various components. Components in a production system could be an electric machine (motor), gearbox, vibration sensor and friction wheel (roller), etc. Associations between components could be a drive relationship between an electric machine and a gearbox, a physical connection relationship between a vibration sensor and a friction wheel, etc.

Features of various devices or components and associations between various devices or components during automated production, which are described by a semantic model, may be used for example to simulate, and perform data analysis on, the operating situation of various devices during automated production. Thus, the precision of description by a semantic model will have a direct impact on the accuracy of simulation and data analysis.

SUMMARY

A semantic model is generally constructed manually according to an automated production process, or constructed with the aid of certain tools, the precision and reliability of which are not high; furthermore, the features of various devices or components and the associations between the various devices or components, which are to be described by a semantic model, are relatively complex and variable. For these reasons, the inventors have recognized that the semantic model that is constructed may not be precise.

In view of the above, embodiments of the present invention provides a model processing method, apparatus and/or machine-readable medium, which are intended to evaluate the precision of a semantic model, in order to discover an imprecise semantic model, and then adjust the semantic model according to an evaluation result.

In a first aspect, an embodiment of the present invention provides a model processing method, for evaluating a semantic model to be evaluated of a target production system, the method comprising:

acquiring feature information for describing a feature of a reference semantic model of at least one other production system; and evaluating, on the basis of the feature information acquired, the precision of the semantic model to be evaluated.

In a second aspect, an embodiment of the present invention provides a model processing apparatus, for evaluating a semantic model to be evaluated of a target production system, the apparatus comprising:

a first acquisition module, for acquiring feature information for describing a feature of a reference semantic model of at least one other production system; and an evaluation module, for evaluating, on the basis of the feature information acquired by the first acquisition module, the precision of the semantic model to be evaluated.

In a third aspect, an embodiment of the present invention provides a model processing apparatus, for evaluating a semantic model to be evaluated of a target production system, the apparatus comprising:

at least one memory, for storing a semantic model evaluation program; and at least one processor, for calling the semantic model evaluation program stored in the at least one memory, and executing any one of the embodiments of methods described above.

In a fourth aspect, an embodiment of the present invention provides a machine-readable medium, wherein a machine-readable instruction is stored on the machine-readable medium, and the machine-readable instruction, when executed by a processor, causes the processor to execute any one of the embodiments of the model processing methods described above.

LIST OF LABELS USED IN THE DRAWINGS

Figure 1:
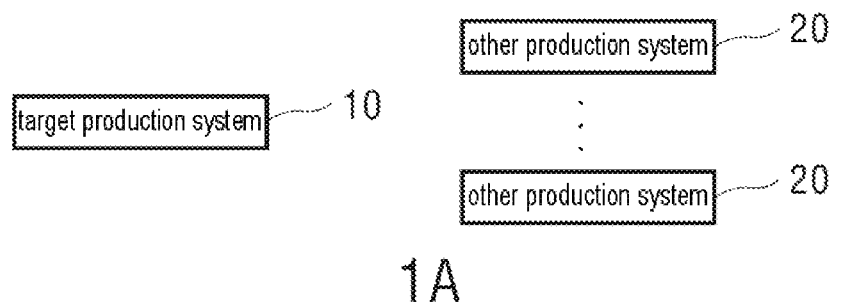
FIG. 1A is a schematic diagram of a target production system and at least one other production system provided in an embodiment of the present invention.
FIG. 1B is a flow chart of a model processing method provided in an embodiment of the present invention.
Figure 1:
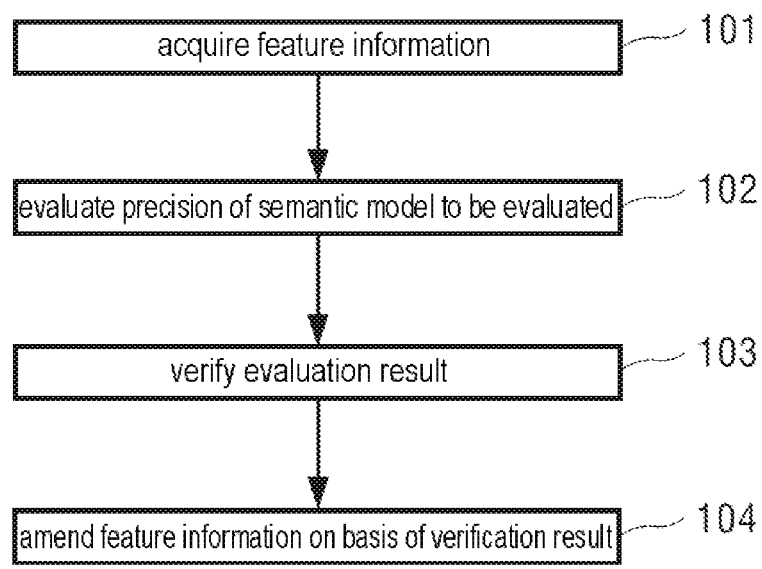

10: target production 20: other production 101: acquire system; system; feature information;
102: evaluate precision of semantic model to be evaluated;
103: verify evaluation result;
104: amend feature information on basis of verification result;
301: acquire first probability of first association;
302: determine whether first association exists between relevant components in target production system described by semantic model to be evaluated;
303: evaluate precision of semantic model to be evaluated, on basis of first probability and determination result.
601: for each of at least two combinations of components, acquire second probability of second association;
602: for each combination, determine whether second association corresponding to the combination exists in target production system described by semantic model to be evaluated;
603: on basis of second probability corresponding to each combination and determination result, evaluate precision of semantic model to be evaluated;
1401: acquire probability corresponding to association stored in feature library;
1402: grade each association described by semantic model to be evaluated;
1403: on basis of at least one reference semantic model stored in historical library, acquire associations corresponding to at least two combinations;
1404: grade a region described by semantic model to be evaluated;
1405: allocate initial labels for association and region;
1406: adjust association grading result and region grading result;
1407: amend association initial label and region initial label;
1408: output association for which probability is less than preset precision threshold;
1409: amend probability corresponding to association stored in feature library;
1410: store adjusted semantic model to be evaluated in historical library;
150: semantic model 1501: model 1502: feature evaluation system; processing library; apparatus;
1503: historical library; 1801: first 1802: acquisition module; evaluation module;
18021: first determination 18022: first evaluation sub-module; sub-module;
18023: second 18024: second evaluation sub-module; determination sub-module;
1803: list outputting 1804: second 1805: module; acquisition module; verification module;
1806: alteration module; 2101: at least one memory;
2102: at least one processor;

DETAILED DESCRIPTION OF EXAMPLE EMBODIMENTS

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/ hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flowcharts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

In a first aspect, an embodiment of the present invention provides a model processing method, for evaluating a semantic model to be evaluated of a target production system, the method comprising:

acquiring feature information for describing a feature of a reference semantic model of at least one other production system; and evaluating, on the basis of the feature information acquired, the precision of the semantic model to be evaluated.

Since semantic models describing different production systems have identical or similar features, the precision of a semantic model to be evaluated is evaluated on the basis of a feature of a semantic model which already exists, i.e. the semantic model of the other production system mentioned above, so as to obtain an evaluation result for the semantic model to be evaluated, thereby realizing evaluation of the precision of the semantic model to be evaluated of the target production system.

Optionally, a semantic model of a production system may be used to describe at least one of the following three items of content:

item 1: an attribute of each of at least two components included in the production system;

item 2: data generated by the at least two components;

item 3: an association between the at least two components in a production process executed by the production system.

Since a semantic model of a production system is used to describe at least one of the three items of content above, evaluation of the precision of a semantic model to be evaluated of a target production system can be realized by evaluating any one or more of the three items of content above.

Optionally, a semantic model of a production system describes an association between at least two components included in the production system, each other production system comprising a first type of component and a second type of component, wherein the feature information comprises:

a first probability that the first type of component and the second type of component have a first association.

Further, the step of evaluating, on the basis of the feature information acquired, the precision of the semantic model to be evaluated, comprises:

determining, on the basis of the semantic model to be evaluated, whether the first association exists between a component belonging to the first type of component and a component belonging to the second type of component and connected to the component belonging to the first type of component in the target production system, as a first determination result; and evaluating, on the basis of the first probability and the first determination result, the precision of the semantic model to be evaluated.

The description, by a semantic model, of an association between two components in a production process executed by a production system will have a direct impact on the precision of the semantic model; therefore the abovementioned process, by way of a first probability corresponding to an association described by feature information, determines whether an association exists between two specific types of component described by a semantic model to be evaluated of a target production system, and evaluates the precision of the semantic model to be evaluated on the basis of a determination result, thereby providing a method for evaluating semantic model precision.

Optionally, a semantic model of a production system describes an association between at least two components included in the production system, each other production system comprising at least three types of component, wherein the feature information may comprise: a second probability, for the other production system, that a second association exists between two types of component involved in each of at least two pairwise combinations of the at least three types of component.

Further, the step of evaluating, on the basis of the feature information acquired, the precision of the semantic model to be evaluated, comprises:

for each of the at least two combinations, and based on the semantic model to be evaluated, determining whether the second association corresponding to the combination exists between each pair of connected components belonging respectively to two types of component involved in the combination in the target production system, as a second determination result; and on the basis of the second probability corresponding to each of the at least two combinations, and the second determination result, evaluating the precision of the semantic model to be evaluated.

Since at least two pairwise combinations of at least three types of component in a production system can form a region in the production system, the precision of description of a region of the production system by a semantic model of the production system can be evaluated.

Optionally, a portion of or all of the at least one other production system is of the same type as the target production system.

Since semantic models of production systems of the same type have a high degree of similarity, the accuracy of the evaluation result can be increased by ensuring that a portion of or all of the at least one other production system is of the same type as the target production system.

Optionally, the step of evaluating, on the basis of the feature information acquired, the precision of the semantic model to be evaluated, comprises:

obtaining scoring information relating to the precision of the semantic model to be evaluated.

Optionally, the step of evaluating, on the basis of the feature information acquired, the precision of the semantic model to be evaluated, comprises:

obtaining indication information relating to a precision rank of the semantic model to be evaluated.

The result of evaluating the semantic model to be evaluated can be displayed in a more visually direct way by way of the scoring information and/or indication information.

Optionally, after the step of evaluating, on the basis of the feature information acquired, the precision of the semantic model to be evaluated, also included is the following:

on the basis of a result of the evaluation, setting out a list of a part lower than a preset semantic model precision threshold in the semantic model to be evaluated.

Through the list, an evaluation result worthy of attention can be presented, to remind a user to pay special attention or provide confirmation, to guide a subsequent process of semantic model correction.

Optionally, the method further comprises: acquiring field data generated in a production process executed by the target production system;

and after the step of evaluating, on the basis of the feature information acquired, the precision of the semantic model to be evaluated, further comprises:

verifying a result of the evaluation on the basis of the field data.

When content which a semantic model of a production system is used to describe comprises item two mentioned above, field data generated by the production system in a production process may also be apart described by the semantic model; when content which a semantic model of a production system is used to describe comprises item three mentioned above, field data generated by the production system in a production process can also reflect associations between corresponding components in the production system to a certain extent, thus the accuracy of an evaluation result is further ensured by the abovementioned step of verifying a result of the evaluation on the basis of the field data.

Optionally, the step of verifying a result of the evaluation on the basis of the field data comprises:

verifying a result of the evaluation on the basis of data item configuration information of the target production system and the field data, wherein the data item configuration information is description information, for the field data, of the semantic model to be evaluated of the target production system.

A correspondence relationship between a component described by a semantic model to be evaluated of the target production system and field data generated by a component in a production process of the target production system is realized by data item configuration information; the correspondence relationship can ensure accurate correspondence between a component and field data, so as to ensure the accuracy of verification of an evaluation result by field data.

Optionally, after the step of verifying the evaluation result on the basis of the field data, the following is also included:

amending the feature information on the basis of a result of the verification.

By amending the feature information, the accuracy of the feature information is increased; moreover, when the feature information is subsequently used to evaluate another semantic model to be evaluated, the accuracy of evaluation of the other semantic model to be evaluated can be further increased.

In a second aspect, an embodiment of the present invention provides a model processing apparatus, for evaluating a semantic model to be evaluated of a target production system, the apparatus comprising:

a first acquisition module, for acquiring feature information for describing a feature of a reference semantic model of at least one other production system; and an evaluation module, for evaluating, on the basis of the feature information acquired by the first acquisition module, the precision of the semantic model to be evaluated.

Since semantic models describing different production systems have identical or similar features, the precision of a semantic model to be evaluated is evaluated on the basis of a feature of a semantic model which already exists, i.e. the semantic model of the other production system mentioned above, so as to obtain an evaluation result for the semantic model to be evaluated, thereby realizing evaluation of the precision of the semantic model to be evaluated of the target production system.

Optionally, a semantic model of a production system may be used to describe at least one of the following three items of content:

item 1: an attribute of each of at least two components included in the production system;

item 2: data generated by the at least two components; and item 3: an association between the at least two components in a production process executed by the production system.

Since a semantic model of a production system is used to describe at least one of the three items of content above, evaluation of the precision of a semantic model to be evaluated of a target production system can be realized by evaluating any one or more of the three items of content above.

Optionally, a semantic model of a production system describes an association between at least two components included in the production system, each other production system comprising a first type of component and a second type of component, and the first acquisition module, when acquiring the feature information, is specifically used for acquiring a first probability that the first type of component and the second type of component have a first association;

the evaluation module comprises: a first determination sub-module and a first evaluation sub-module, wherein the first determination sub-module is used for determining, on the basis of the semantic model to be evaluated, whether the first association exists between a component belonging to the first type of component and a component belonging to the second type of component and connected to the component belonging to the first type of component in the target production system;

the first evaluation sub-module is used for evaluating the precision of the semantic module to be evaluated, on the basis of the first probability acquired by the first acquisition module and a first determination result of determination by the first determination sub-module.

The description, by a semantic model, of an association between two components in a production process executed by a production system will have a direct impact on the precision of the semantic model; therefore the abovementioned apparatus, by way of a first probability corresponding to an association described by feature information, determines whether an association exists between two specific types of component described by a semantic model to be evaluated of a target production system, and evaluates the precision of the semantic model to be evaluated of the production system on the basis of a determination result, thereby providing a method for evaluating semantic model precision.

Optionally, a semantic model of a production system describes an association between at least two components included in the production system, and each other production system comprises at least three types of component;

the first acquisition module, when acquiring the feature information, is specifically used for acquiring a second probability, for the other production system, that a second association exists between two types of component involved in each of at least two pairwise combinations of the at least three types of component;

the evaluation module comprises: a second determination sub-module and a second evaluation sub-module, wherein the second determination sub-module is used for determining, for each of the at least two combinations, and based on the semantic model to be evaluated, whether the second association corresponding to the combination exists between each pair of connected components belonging respectively to two types of component involved in the combination in the target production system;

the second evaluation sub-module is used for evaluating the precision of the semantic model to be evaluated, on the basis of the second probability corresponding to each of the at least two combinations acquired by the first acquisition module, and a second determination result of determination by the second determination sub-module.

Since at least two pairwise combinations of at least three types of component in a production system can form a region in the production system, the precision of description of a region of the production system by a semantic model of the production system can be evaluated.

Optionally, a portion of or all of the at least one other production system is of the same type as the target production system.

Since semantic models of production systems of the same type have a high degree of similarity, the accuracy of the evaluation result can be increased by the first acquisition module acquiring a portion of or all of at least one other production system of the same type as the target production system.

Optionally, the evaluation module may be used to obtain scoring information relating to the precision of the semantic model to be evaluated.

Optionally, the evaluation module may be used to obtain indication information relating to a precision rank of the semantic model to be evaluated.

The result of evaluating the semantic model to be evaluated can be displayed in a more visually direct way by way of the scoring information and/or indication information.

Optionally, the apparatus further comprises: a list outputting module, for setting out, on the basis of a result of evaluation by the evaluation module, a list of a part lower than a preset semantic model precision threshold in the semantic model to be evaluated.

Through the list set out by the list outputting module, an evaluation result worthy of attention can be presented, to remind a user to pay special attention or provide confirmation, to guide a subsequent process of semantic model correction.

Optionally, the apparatus further comprises: a second acquisition module and a verification module, wherein the second acquisition module is used for acquiring field data generated in a production process executed by the target production system;

the verification module is used for verifying a result of evaluation by the evaluation module on the basis of field data acquired by the second acquisition module.

When content which a semantic model of a production system is used to describe comprises item two mentioned above, field data generated by the production system in a production process may also be apart described by the semantic model; when content which a semantic model of a production system is used to describe comprises item three mentioned above, field data generated by the production system in a production process can also reflect associations between corresponding components in the production system to a certain extent, thus the accuracy of an evaluation result is further ensured by the abovementioned step of verifying a result of the evaluation on the basis of the field data.

Optionally, the verification module is specifically used for verifying the evaluation result on the basis of data item configuration information of the target production system and the field data acquired by the second acquisition module, wherein the data item configuration information is description information, for the field data, of a semantic model to be evaluated of the target production system.

A correspondence relationship between a component described by a semantic model to be evaluated of the target production system and field data generated by a component in a production process of the target production system is realized by data item configuration information, so as to ensure the accuracy of verification of an evaluation result by field data.

Optionally, the apparatus further comprises: an alteration module, for amending the feature information on the basis of a result of verification by the verification module.

By amending the feature information, the accuracy of the feature information is increased; moreover, when the feature information is subsequently used to evaluate another semantic model to be evaluated, the accuracy of evaluation of the other production system to be evaluated can be further increased.

In a third aspect, an embodiment of the present invention provides a model processing apparatus, for evaluating a semantic model to be evaluated of a target production system, the apparatus comprising:

at least one memory, for storing a semantic model evaluation program; and at least one processor, for calling the semantic model evaluation program stored in the at least one memory, and executing any one of the embodiments of methods described above.

Through the execution of any one of the methods described above by the apparatus, evaluation of the precision of a semantic model of a production system can be realized.

In a fourth aspect, an embodiment of the present invention provides a machine-readable medium, wherein a machine-readable instruction is stored on the machine-readable medium, and the machine-readable instruction, when executed by a processor, causes the processor to execute any one of the embodiments of the model processing methods described above.

A semantic model of a production system may describe various components in the production system, data generated by components in a production process executed by the production system, and associations between components in the production process executed by the production system. When a production process of a production system is simulated, or a production process of a production system is subjected to data analysis, a semantic model of the production system is often taken as a basis. Thus, the precision of a semantic model of a production system will have a direct impact on a simulation result of the production system or a data analysis result of the production system. In order to obtain a semantic model of high precision, the precision of a semantic model corresponding to a production system may first be evaluated, then the semantic model may be adjusted according to an evaluation result.

An embodiment of the present invention evaluates the precision of a semantic model to be evaluated of a target production system. Feature information is acquired via a model processing apparatus, the feature information being used to describe a feature of a reference semantic model of at least one other production system, and the precision of the semantic model to be evaluated is evaluated according to the feature information acquired. A solution for evaluating the precision of a semantic model to be evaluated is provided.

Since reference is made to a feature of a reference semantic model of another production system, there is a reference basis for evaluation of the precision of the semantic model to be evaluated, so the evaluation result is more accurate.

An embodiment of the present invention mentions that a semantic model can be used to describe various components in a production system (e.g. a factory), attributes of the various components, data generated by the various components during production, and associations between the various components.

A target production system could be a factory, and could also be one or more production lines etc. in a factory.

A reference semantic model of at least one other production system could be a semantic model that already exists and is used, such as a semantic model of a production system of a brand of motor vehicle, and could also be a template produced by a statistical method on the basis of existing experience or standards, e.g. a template produced by a statistical method through the international standard for the integration of enterprise and control systems, standard ISA95, etc.

Associations between various components mentioned in an embodiment of the present invention include but are not limited to a bearing association, a drive association and a sequence association, etc., e.g. an electric machine 1 is connected by a bearing to a vibration sensor, electric machine 1 drives a gearbox, an electric machine 2 begins operating after electric machine 1 operates, etc.

A joint probability mentioned in a portion of embodiments of the present invention may be the probability that at least two associations described by a semantic model will occur simultaneously.

A region of a target production system mentioned in an embodiment of the present invention may be composed of at least two pairwise combinations of at least three types of component described by a semantic model to be evaluated of the target production system, and associations involved in the at least two combinations.

Field data mentioned in an embodiment of the present invention may comprise time sequence operating data, e.g. real-time rotation speed of a gearbox, generated in real time by various components during execution of a production process by a target production system.

The method and equipment provided in embodiments of the present invention are explained in detail below with reference to the accompanying drawings.

FIG. 1B is a flow chart of a model processing method provided in an embodiment of the present invention. The model processing method may be executed by a model processing apparatus provided in an embodiment of the present invention, and may be used to evaluate a semantic model to be evaluated of a target production system 10 shown in FIG. 1A, the method specifically comprising:

step 101: acquiring feature information for describing a feature of a reference semantic model of at least one other production system 20 shown in FIG. 1A;

step 102: evaluating, on the basis of the feature information acquired, the precision of a semantic model to be evaluated.

A semantic model of a production system may be used to describe at least one of the following three items of content:

an attribute of each of at least two components included in the production system;

data generated by the at least two components;

an association between the at least two components in a production process executed by the production system.

In the method given in the embodiment shown in FIG. 1B, semantic models describing different productions systems have identical or similar features, therefore the precision of the semantic model to be evaluated (e.g. the semantic model to be evaluated of the target production system 10 in FIG. 1A, mentioned in an embodiment of the present invention) is evaluated on the basis of a semantic model which already exists (e.g. the reference semantic model of at least one other production system 20 in FIG. 1A, mentioned in an embodiment of the present invention), i.e. evaluation of the precision of a semantic model to be evaluated is achieved.

Figure 2:
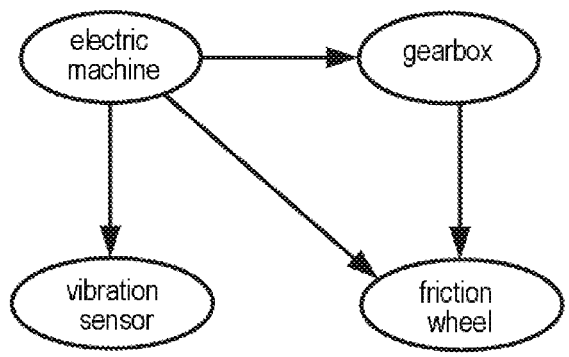
FIG. 2 is a schematic structural diagram of a target production system provided in an embodiment of the present invention.

In a specific application, the content that the semantic model to be evaluated of the target production system 10 as shown in FIG. 1A is used to describe may include: an association between at least two components included in the target production system 10, in a production process executed by the target production system 10. An example may be as shown in FIG. 2; a production system 10 may comprise an electric machine, a gearbox, a vibration sensor and a friction wheel. Thus, content described by a semantic model to be evaluated of the target production system 10 shown in FIG. 2 may comprise: during production, associations between the electric machine and the vibration sensor, between the electric machine and the gearbox, and between the gearbox and the friction wheel, i.e. associations which the electric machine has with the vibration sensor and the gearbox respectively, and an association between the gearbox and the friction wheel.

An optional embodiment of step 102 shown in FIG. 1B, evaluating the precision of the semantic model to be evaluated of the target production system 10, could be evaluating the precision of each association between at least two components described by the semantic model to be evaluated; and could also be evaluating the precision of a region formed by at least two pairwise combinations of at least three types of components described by the semantic model to be evaluated of the target production system 10, and associations involved in the at least two combinations. Thus, the model processing method shown in FIG. 1B may comprise the following two application scenarios.

Figure 3:
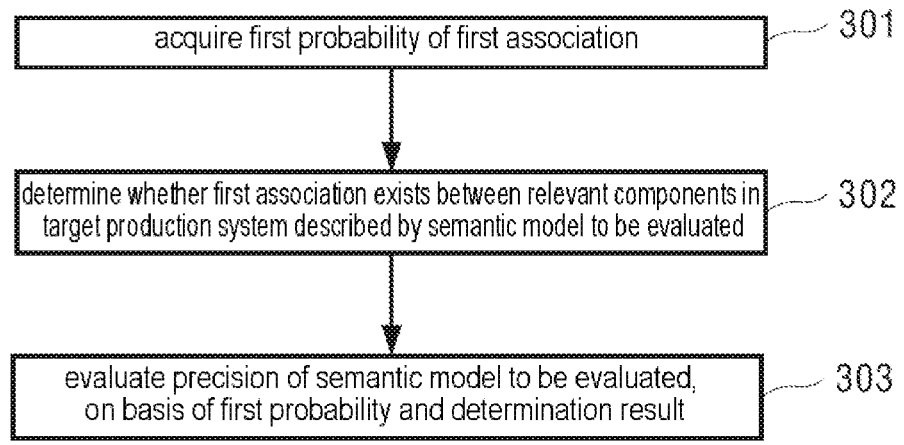
FIG. 3 is a flowchart of a model processing method provided in an embodiment of the present invention.
Figure 4:
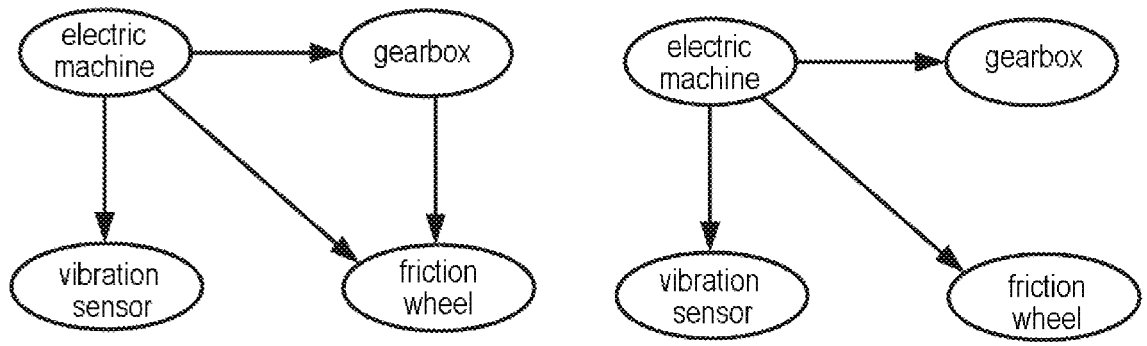
FIG. 4 is a schematic structural diagram of at least one other production system provided in an embodiment of the present invention.
Figure 4:
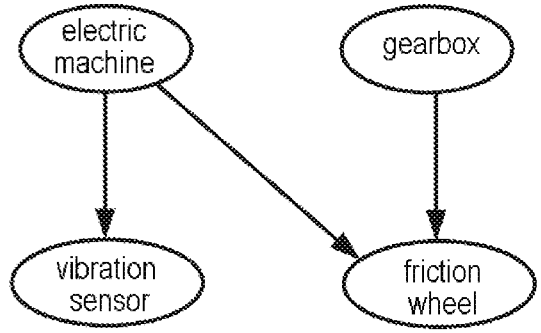

Application scenario 1: evaluating the precision of each association between components described by the semantic model to be evaluated of the target production system 10. As shown in FIG. 3, the steps of the method of the application scenario 1 comprise:

step 301: on the basis of a reference semantic model of at least one other production system 20, acquiring a first probability that a first type of component and a second type of component included in at least one other production system 20 have a first association;

this step may be a sub-step of step 101 shown in FIG. 1B, e.g.: feature information specifically acquired thereby may comprise: a first probability corresponding to an association between an electric machine and a gearbox in at least one other production system 20 as shown in FIG. 4, e.g. a probability corresponding to a drive relationship between an electric machine and a gearbox.

The first probability may be calculated according to the following calculation formula 1:

$$P(i/j) = \frac{x_{i/j}}{y_i} \qquad (1)$$

wherein $P(i/j)$ characterizes the probability that a component i is associated with a component j; $x_{i/j}$ characterizes the number of times that an association occurs between component i and component j in at least one other production system 20; $y_i$ characterizes the total number of times that an association occurs between component i and any component in at least one other production system 20. In the three other production systems 20 shown in FIG. 4, suppose that component i is an electric machine, component j is a gearbox, and a drive relationship between an electric machine serving as component i and a gearbox serving as component j occurs once in both FIG. 4A and FIG. 4B, so $x_{i/j}=2$.

Furthermore, in FIG. 4A an association occurs between the electric machine and any component 3 times (the electric machine is associated with the gearbox, the electric machine is associated with the vibration sensor, and the electric machine is associated with the friction wheel), in FIG. 4B an association occurs between the electric machine and any component 3 times (the electric machine is associated with the gearbox, the electric machine is associated with the vibration sensor, and the electric machine is associated with the friction wheel), and in FIG. 4C an association occurs between the electric machine and any component 2 times (the electric machine is associated with the vibration sensor, and the electric machine is associated with the friction wheel); thus, in the three other production systems shown in FIG. 4, the total number of times that an association occurs between an electric machine and any component is $y_i=3+3+2=8$. Thus the probability corresponding to a drive relationship between an electric machine and a gearbox is 2/8=0.25.

Figure 5:
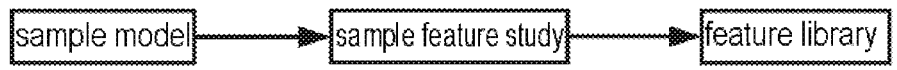
FIG. 5 is a flow chart of feature study of a sample model provided in an embodiment of the present invention.

Furthermore, as shown in FIG. 5, in this step, a reference semantic model of at least one other production system may serve as a sample model, an association between components in the sample model may be obtained in advance by sample feature study, and a probability corresponding to the association between components is calculated by calculation formula 1 above; and the association between components, and the probability corresponding to the association between components, are stored in a feature library.

Through the abovementioned statistical determination of the probability of occurrence of an association, it may be concluded that if one type of association might exist and might not exist in a production system, then the probability corresponding thereto will be relatively small or even 0. On this basis, evaluation of an association described by a semantic model of a production system may be realized through steps 302 and 303 below.

Step 302: based on a semantic model to be evaluated of a target production system 10, determining whether the first association exists between a component belonging to the first type of component and a component belonging to the second type of component and connected to the component belonging to the first type of component in the target production system 10;

this step is a sub-step of step 102 shown in FIG. 1B. For example: in this step, it can be determined whether a drive relationship etc. exists between the electric machine and the gearbox shown in FIG. 2.

Step 303: evaluating the precision of the semantic model to be evaluated, on the basis of the first probability and a determination result.

This step is a sub-step of step 102 shown in FIG. 1B. In this step, the determination result may comprise: the first association exists between a component belonging to the first type of component and a component belonging to the second type of component and connected to the component belonging to the first type of component, or the first association does not exist between a component belonging to the first type of component and a component belonging to the second type of component and connected to the component belonging to the first type of component. A result of evaluating the precision of the semantic model to be evaluated in this step is obtained on the basis of the determination result of step 302 above and the first probability of the first association acquired in step 301.

Evaluating the precision of the semantic model to be evaluated in step 303 may comprise: grading an association described by the semantic model to be evaluated, and labels of different colors may be allocated to associations according to grading, to locate associations which have lower precision.

The grading of associations can be split into the following two situations:

The first situation may comprise: the determination result is that the first association exists between a component belonging to the first type of component and a component belonging to the second type of component and connected to the component belonging to the first type of component; then the following calculation formula 2 is used to grade the association, to obtain a grading result, i.e. a fractional value corresponding to the association.

$$f_{i/j}=0.8+P(i/j)\times 0.2 \qquad (2)$$

where $f_{i/j}$ characterizes the grading result of the association between component i and component j; $P(i/j)$ characterizes the probability that component i is associated with component j; 0.8 characterizes a standard fraction that is preset for the association; 0.2 characterizes a weighting.

The second situation may comprise: the determination result is that the first association does not exist between a component belonging to the first type of component and a component belonging to the second type of component and connected to the component belonging to the first type of component; then the grading result obtained is 0. Based on calculation formula 2 mentioned above, it can be seen that if an association really exists in the target production system, then the fractional value of the grading result obtained therefor will be relatively large; if an association might exist and might not exist in the target production system, then the probability corresponding thereto will be relatively small or even 0. Thus, in the determined results of association grading, if the fractional value of the result of association grading is higher, this indicates that the possibility of the association occurring in the target production system is higher, so this can reflect that the description of the association by the semantic model to be evaluated is more precise; when the fractional value of an association is lower or even 0, this indicates that the possibility of the association occurring in the target production system is lower, so this can reflect that the description of the association by the semantic model to be evaluated is less precise. Thus, the precision of an association between two components described by a semantic model to be evaluated is expressed in a relatively visually direct way by way of the grading result.

In the process described above, an association lower than a preset fraction threshold can be marked, in order to make it easier to locate an association of low precision, and facilitate confirmation of whether the association of low precision described by a semantic model is accurate.

Furthermore, in order to facilitate acquisition of feature information, a first association existing between a first type of component and a second type of component described by a reference semantic model of at least one other production system 20, and a first probability of the first association calculated by calculation formula 1, can be stored in at least one feature library in advance; then during acquisition of feature information, direct acquisition from the feature library is possible.

Figure 6:
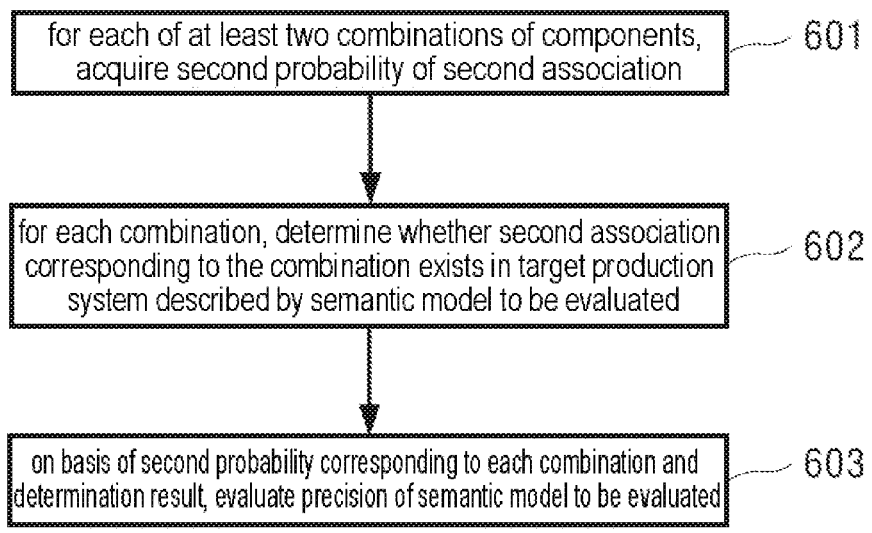
FIG. 6 is a flow chart of a model processing method provided in an embodiment of the present invention.

Application scenario 2: evaluating a region composed of at least three components described by a semantic model to be evaluated of a target production system 10 and an association corresponding to each pair of components in the at least three components. The region is composed of at least two pairwise combinations of at least three types of component, and an association between two types of component involved in each combination. As shown in FIG. 6, the steps of the method of the application scenario 2 comprise:

step 601: on the basis of a reference semantic model of at least one other production system 20, acquiring at least two pairwise combinations of at least three types of component, a second probability that a second association exists between two types of component involved in each of the combinations;

this step is a sub-step of step 101 shown in FIG. 1B. For example: a probability corresponding to a drive relationship between the electric machine and the gearbox shown in FIG. 4A, and a probability corresponding to a bearing connection relationship between the electric machine and the vibration sensor, may be acquired; the probability corresponding to the drive relationship between the electric machine and the gearbox, and the probability corresponding to the bearing connection relationship between the electric machine and the vibration sensor, may be calculated using calculation formula 1.

Furthermore, storing a probability corresponding to an association in a feature library in advance has already been mentioned above; thus, in this step, the process of acquiring the second probability could also be direct retrieval from a feature library.

Furthermore, a reference semantic model of at least one other production system 20 may be stored in a historical library in advance as a sample model. Thus, at least two pairwise combinations of at least three types of component may be obtained by directly acquiring in a description of a reference semantic model of any other production system in a historical library.

Figure 7:
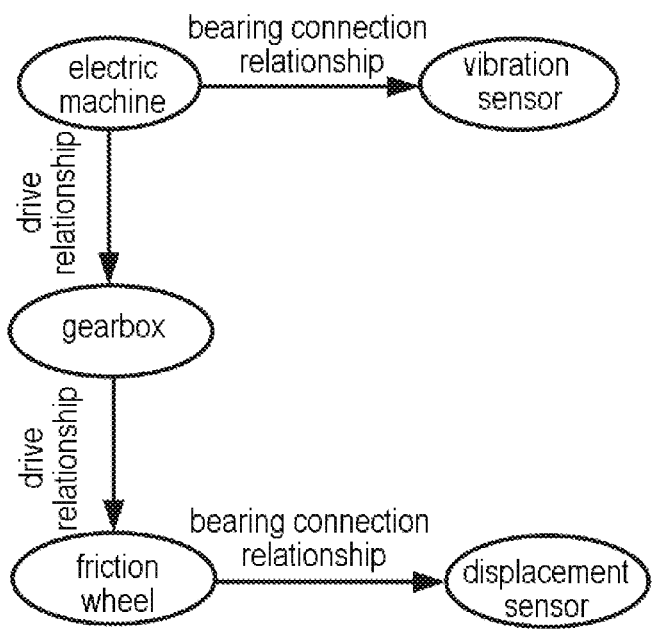
FIG. 7 is a schematic structural diagram of a region provided in an embodiment of the present invention.

Step 602: for each of the at least two combinations, and based on a semantic model to be evaluated of the target production system 10, determining whether the second association corresponding to the combination exists between each pair of connected components belonging respectively to two types of component involved in the combination in the target production system 10;

This step is a sub-step of step 102 shown in FIG. 1B. In this step, a determination result comprises: in the target production system 10 described by the semantic model to be evaluated, the second association corresponding to the combination exists between each pair of connected components belonging respectively to two types of component involved in the combination; or in the target production system 10 described by the semantic model to be evaluated, the second association corresponding to the combination does not exist between each pair of connected components belonging respectively to two types of component involved in the combination. For example: in this step, in the target production system 10 described by the semantic model to be evaluated, a region composed of at least three components, as shown in FIG. 7, comprises: a drive relationship between an electric machine and a gearbox, a bearing connection relationship between the electric machine and a vibration sensor, a drive relationship between the gearbox and a friction wheel, and a bearing connection relationship between the friction wheel and a displacement sensor. Through this step, it is possible to determine whether a region composed of the drive relationship between the electric machine and the gearbox, the bearing connection relationship between the electric machine and the vibration sensor, the drive relationship between the gearbox and the friction wheel, and the bearing connection relationship between the friction wheel and the displacement sensor, exists in at least one other production system 20.

Step 603: on the basis of the second probability corresponding to each of the at least two combinations, and a determination result, evaluating the precision of the semantic model to be evaluated.

This step is a sub-step of step 102 shown in FIG. 1B. A result of evaluation may comprise: grading of a region composed of at least three components in a target production system described by a semantic model to be evaluated, and marking components in the region with different colors according to grading of the region, in order to locate a region with a low probability of occurrence, and facilitate searching, in order to confirm whether the region with the low probability of occurrence is accurate.

The specific evaluation process in this step may comprise:
on the basis of the second probability corresponding to two types of component involved in each of the at least two combinations, calculating a joint probability corresponding to the at least two combinations. The joint probability may be calculated by calculation formula 3 below:

$$P = \frac{P_1 \times P_2 \times \ldots \times P_n}{P_1 \times P_2 \times \ldots \times P_n + (1-P_1) \times (1-P_2) \times \ldots \times (1-P_n)} \quad (3)$$

where P characterizes the joint probability; $P_i$ characterizes the probability of an association between two types of component involved in an $i^{th}$ combination; the value of i is $1, 2, \ldots, n$; and n characterizes the number of combinations.

For example: in this step, 4 combinations corresponding to 5 components, and corresponding associations, are obtained, being as follows: a drive relationship between an electric machine and a gearbox, a bearing connection relationship between the electric machine and a vibration sensor, a drive relationship between the gearbox and a friction wheel, and a bearing connection relationship between the friction wheel and a displacement sensor, wherein a probability corresponding to the drive relationship between the electric machine and the gearbox is 0.1; a probability corresponding to the bearing connection relationship between the electric machine and the vibration sensor is 0.2; a probability corresponding to the drive relationship between the gearbox and the friction wheel is 0.25, and a probability corresponding to the bearing connection relationship between the friction wheel and the displacement sensor is 0.3; thus, the joint probability corresponding to these 4 combinations is:

$$P = \frac{0.1 \times 0.2 \times 0.25 \times 0.3}{0.1 \times 0.2 \times 0.25 \times 0.3 + (1-0.1) \times (1-0.2) \times (1-0.25) \times (1-0.3)} = 0.004.$$

Furthermore, the probability of an association between two types of component and the abovementioned first probability are acquired by the same process, which is not repeated here.

Next, the joint probability obtained by calculation is used to grade a region composed of any three components in the production system.

Region grading is split into three methods of calculation.

The first method of calculation may be as follows:

in the case where a region composed of at least three components in a target production system 10 described by a semantic model to be evaluated is exactly the same as a partial region in at least one other production system 20, i.e. associations between the various components contained in a region in a target production system 10 are exactly the same as associations between the various components contained in a partial region in at least one other production system 20, then a grading result for the region is calculated using calculation formula 4 below; a label color such as green may be set for components and associations of the region, then the color label such as green is used to output components and associations of a region corresponding to the first method of calculation and described by a semantic model.

$$\varphi_i = 0.8 + P \times 0.2 \tag{4}$$

where $\varphi_i$ characterizes a grading result for a region i; P characterizes the joint probability for region i; 0.8 characterizes a standard fraction that is preset for the first method of calculation; 0.2 characterizes a weighting allocated for the joint probability.

Figure 8:
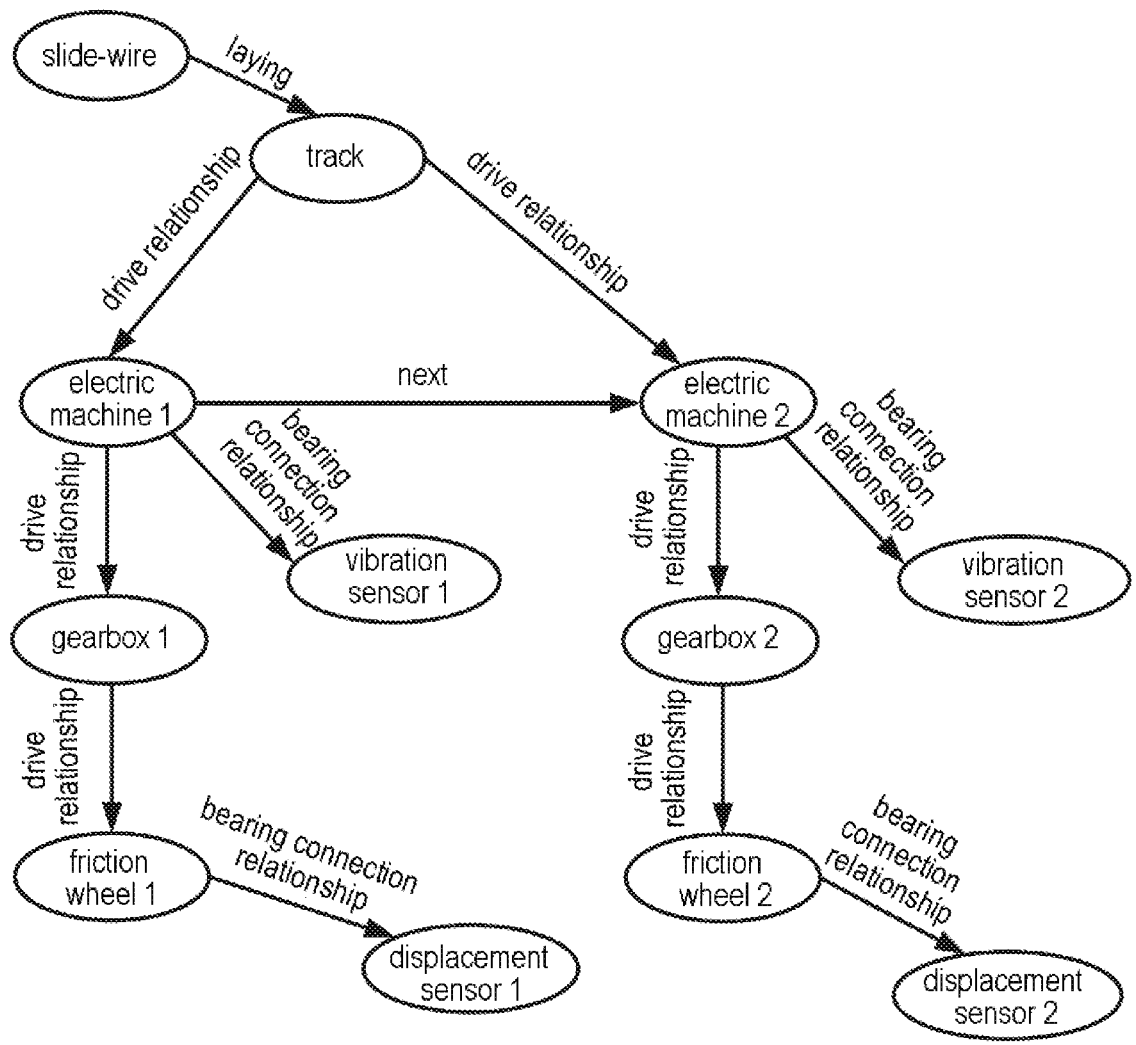
FIG. 8 is a schematic structural diagram of another production system provided in an embodiment of the present invention.

A region as shown in FIG. 7 exists in a production system shown in FIG. 8, so a grading result for the region shown in FIG. 7 is calculated according to calculation formula 4 above; at the same time, components and associations in the region shown in FIG. 7 are outputted with a green label.

The second method of calculation may be as follows: in the case where an association in a region exists in at least one other production system 20, but the region is not the same as any partial region in any other production system, then the grading result is calculated using calculation formula 5 below; furthermore, a label color such as yellow may be allocated to the region, then the color label such as yellow is used to output components and associations of a region corresponding to the second method of calculation and described by a semantic model.

$$\varphi_j = 0.4 + P \times 0.2 \tag{5}$$

where characterizes a grading result for a region j; P characterizes the joint probability for region j; 0.4 characterizes a standard fraction that is preset for the second method of calculation; 0.2 characterizes a weighting allocated for the joint probability.

Figure 9:
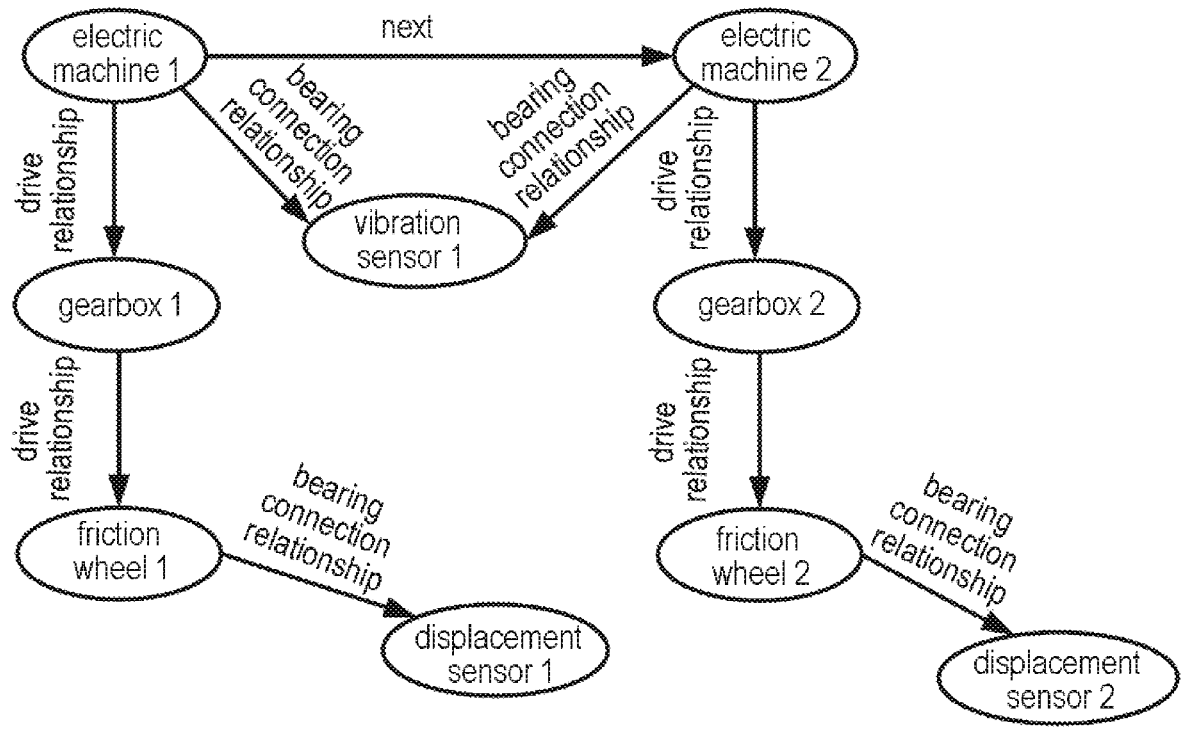
FIG. 9 is a schematic structural diagram of a region provided in an embodiment of the present invention.

A region as shown in FIG. 9 comprises: a sequential connection relationship between an electric machine 1 and an electric machine 2, a bearing connection relationship between electric machine 1 and a vibration sensor 1, and a bearing connection relationship between electric machine 2 and vibration sensor 1. With regard to the bearing connection relationship between electric machine 1 and vibration sensor 1 and the bearing connection relationship between electric machine 2 and vibration sensor 1, although a bearing connection relationship between an electric machine and a vibration sensor exists in another production system shown in FIG. 8, there is no association in which electric machine 1 and electric machine 2 are simultaneously connected to the same vibration sensor 1. Thus, a grading result for the region shown in FIG. 9 is calculated according to calculation formula 5 above, and the association in which electric machine 1 and electric machine 2 are simultaneously connected to the same vibration sensor 1 in the region shown in FIG. 9 is outputted with a yellow label.

Figure 10:
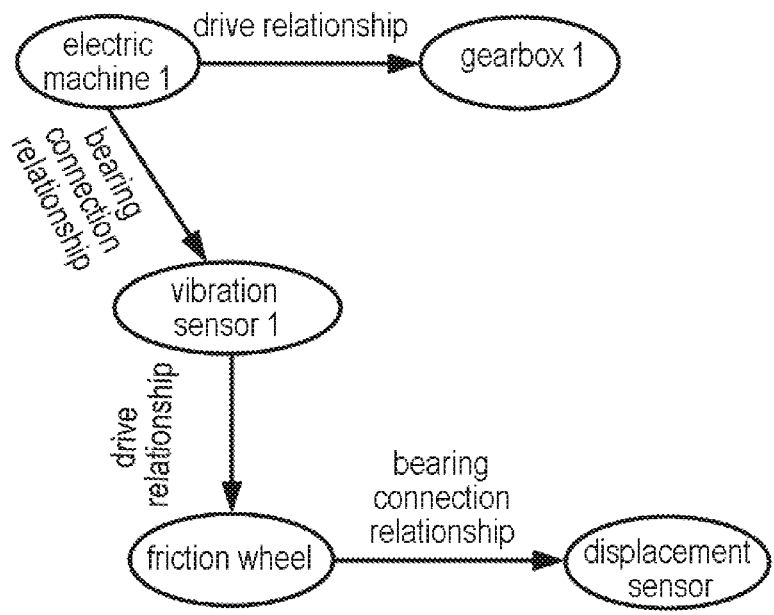
FIG. 10 is a schematic structural diagram of a region provided in an embodiment of the present invention.

The third method of calculation may be as follows: in the case where an association in a region does not exist in another production system, a grading result for the region is 0, then a label color such as red is set for a region corresponding to the third method of calculation, then the region corresponding to the third method of calculation is outputted with the label color such as red. A region as shown in FIG. 10 comprises an association which is a drive relationship between a vibration sensor 1 and a friction wheel; the drive relationship between vibration sensor and friction wheel does not exist in another production system shown in FIG. 8, so a grading result for the region shown in FIG. 10 is 0, and at the same time, components and associations in the region are outputted with a red label.

A region as mentioned above may also be composed of at least one association, i.e. an association may also be referred to as a region.

Furthermore, it can be seen from the three methods of calculation described above that the region grading result obtained is a fractional value, and when the region really exists in a production system, the fractional value obtained therefor will be relatively high. Thus, when a fractional value of a region is low or 0, this indicates that the region must be confirmed. Therefore, evaluation of the precision of a region described by a semantic model is realized through the grading process described above.

Furthermore, when a component or association simultaneously satisfies the first method of calculation and the second method of calculation, the second method of calculation and the corresponding label color such as yellow may be chosen to characterize the component or association (by the low level principle), to ensure the accuracy of evaluation of a region of a target production system 10 described by a semantic model to be evaluated.

Optionally, a portion of or all of the at least one other production system 20 is of the same type as the target production system 10. For example: in the case where a target production system 10 belongs to the motor vehicle manufacturing industry, at least one other production system 20 should also belong to the motor vehicle manufacturing industry; since production systems of the same type have a relatively high degree of similarity, the accuracy of evaluation can be ensured.

Figure 11:
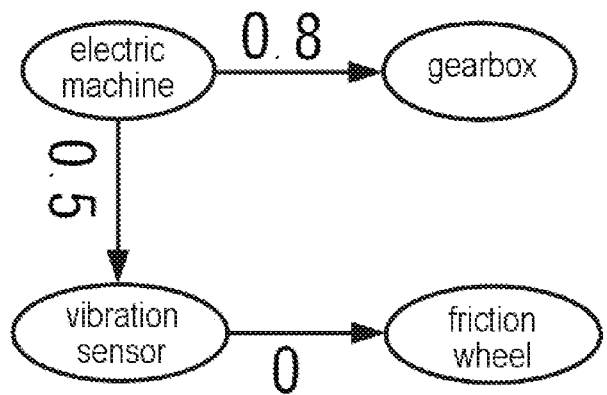
FIG. 11 is a schematic structural diagram of an evaluated production system with fraction markers, provided in an embodiment of the present invention.

In one particular application, an optional method of implementing step 102 above, i.e. evaluating, on the basis of the feature information acquired, the precision of the semantic model to be evaluated, is to obtain scoring information relating to the precision of the semantic model to be evaluated; the scoring information could be a fractional value obtained for an association described by a semantic model to be evaluated as mentioned above, and could also be a fractional value obtained for a region in a target production system 10 described by a semantic model to be evaluated as mentioned above; it is also possible for both to be present at the same time. FIG. 11 shows an outputted target production system 10 corresponding to a semantic model to be evaluated, which has undergone scoring, with a grading result given at each association. With regard to the scoring information, it may be concluded that if an association or a region really exists in the target production system 10 described by the semantic model to be evaluated, then the fraction obtained for the association or the region will be relatively large. Thus, when the fraction obtained for an association or a region is relatively small, e.g. lower than a preset probability threshold, then the possibility of there being a problem with the association or the region is relatively high, and this can be indicated to a user by a marker, to facilitate confirmation of whether the association with low probability or the region with low probability, described by the semantic model to be evaluated, is accurate.

Optionally, an optional method of implementing step 102, i.e. evaluating, on the basis of the feature information acquired, the precision of the semantic model to be evaluated, is to obtain indication information relating to a precision rank of the semantic model to be evaluated. The implementation of this process principally consists of giving different marker labels according to the size of a fractional value obtained for a region or a fractional value obtained for an association, described by a semantic model to be evaluated, as mentioned above. For example: for an association with a probability of 0 and components corresponding thereto, marking can be performed using a red label, and when the target production system 10 described by the semantic model to be evaluated is outputted, the association with the probability of 0 and the components corresponding thereto are displayed in a red color, to facilitate confirmation of whether the place marked by the red label is accurate.

Optionally, the following may be further included after step 102: on the basis of a result of the evaluation, setting out a list of a part lower than a preset semantic model precision threshold in the semantic model to be evaluated. This process principally consists of the following: after grading each association, and on the basis of a grading result, displaying in a list information relating to an association for which the grading result is lower than the semantic model precision threshold, and components corresponding to the association. For example: the preset semantic model precision threshold is 0.5; thus, in the case of the associations described by the semantic model to be evaluated as mentioned above, an association corresponding to two components for which the probability of occurrence is lower than the value of 0.5 is shown in a list, to make it easier to directly locate an association which might have a problem.

Optionally, the abovementioned method may further comprise: acquiring field data generated in a production process executed by a target production system 10; the process may be performed before or after either one of step 101 and step 102 shown in FIG. 1B. On this basis, after step 102, the following may also be included: step 103: verifying a result of evaluation from step 102 on the basis of the field data acquired.

Figure 12:
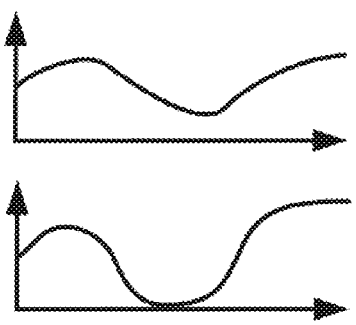
FIG. 12 is waveform graphs of field data generated by two components having an association, provided in an embodiment of the present invention.

The process of verifying an evaluation result by way of field data may be as follows: verifying the evaluation result on the basis of data item configuration information of a target production system and the field data, wherein the data item configuration information is description information, for the field data, of a semantic model to be evaluated of the target production system, e.g.: in a target production system, a speed of an electric machine may be configured as a variable of an electric machine speed 1. The data item configuration information of the target production system can bind a component described by a semantic model to be evaluated with an actual component of a target production system. By acquiring time sequence operating data such as electric machine speed, collected by a collection apparatus, of the various components in a production system, field data is obtained. Since there is a certain association, in terms of time of generation or operating data, between time sequence operating data of two components having an association, e.g. a bearing connection relationship between an electric machine and a vibration sensor, the operating data of the electric machine and the vibration sensor arise at the same time; moreover, waveforms of emergence of a time sequence electric machine speed and a time sequence vibration sensor vibration frequency should coincide, as shown in FIG. 12.

Figure 13:
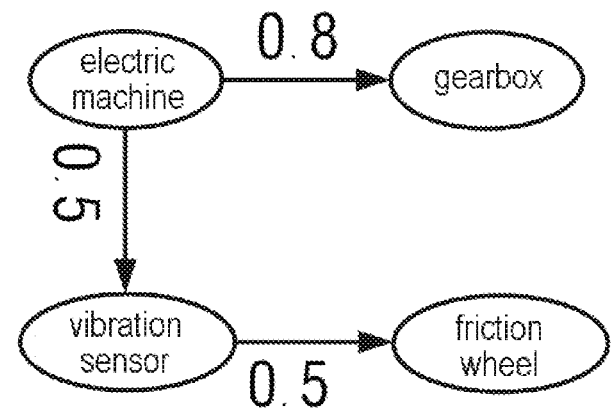
FIG. 13 is a schematic structural diagram of a corrected production system with fraction markers, provided in an embodiment of the present invention.

Optionally, after step 103 described above, i.e. verifying the evaluation result on the basis of the field data, the following may be further included: step 104: amending the feature information on the basis of a result of the verification. Through this process, correction of feature information is achieved. For example: through the abovementioned operating data, it can be known that a fractional value, in a production system, of a drive association between a vibration sensor and a friction wheel is 0.5, whereas the probability, recorded in feature information, of a drive association between a vibration sensor and a friction wheel occurring is 0, so 0.5 replaces 0, to realize the correction of feature information; an output result of a semantic model to be evaluated after correction is shown in FIG. 13. If feature information is a probability of an association stored in a feature library, then the probability of the association stored in the feature library is amended directly, to increase the accuracy of subsequent evaluation.

Figure 14:
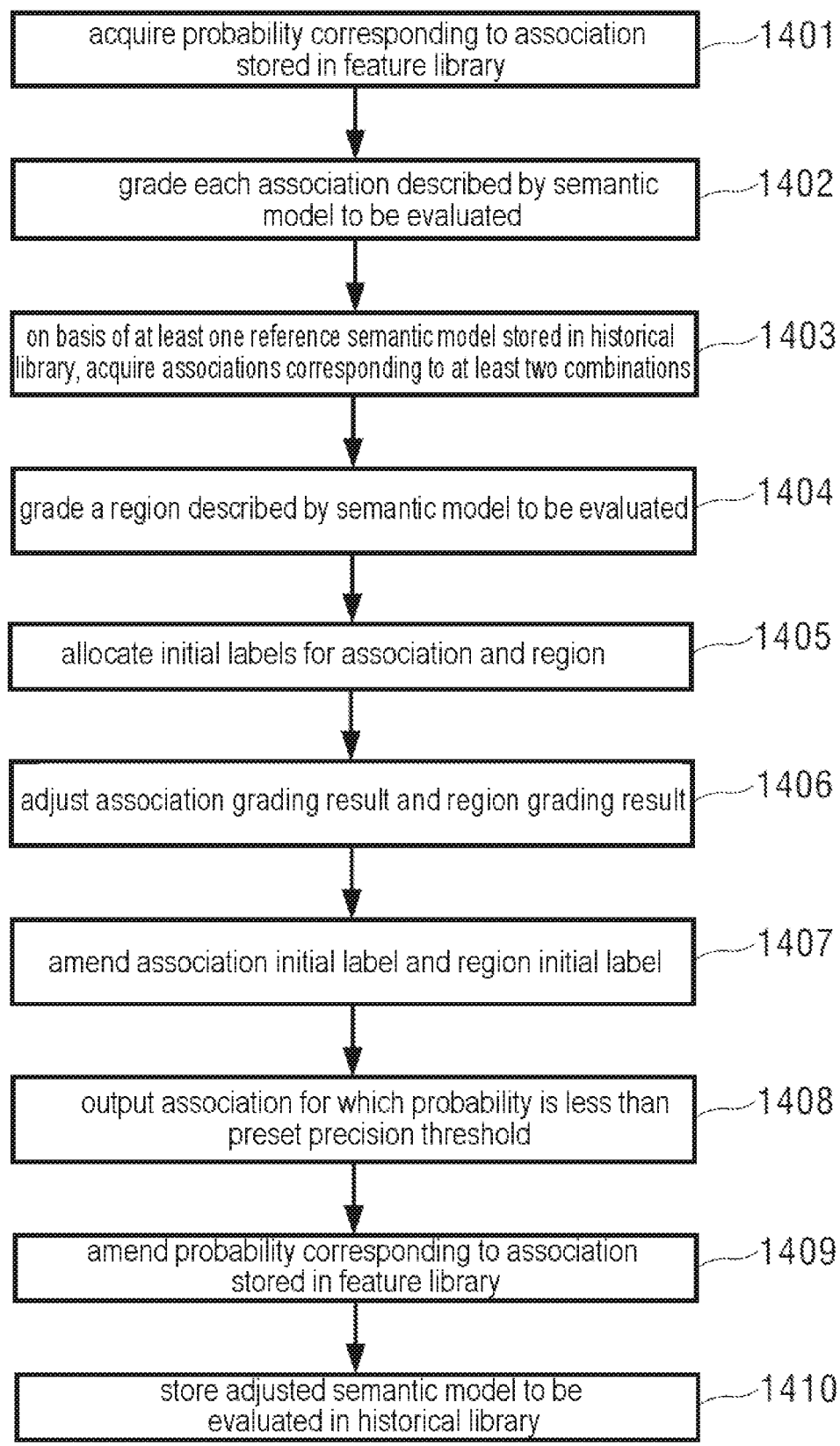
FIG. 14 is a flowchart of a model processing method provided in an embodiment of the present invention.
Figure 15:
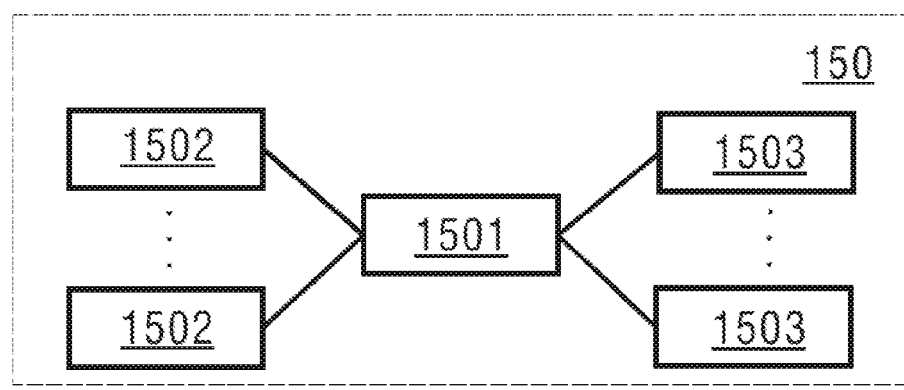
FIG. 15 is a schematic structural diagram of a semantic model evaluation system provided in an embodiment of the present invention.

To enable the result of evaluation to be presented to the user in a relatively visually direct way, and at the same time ensure the accuracy of evaluation, in another embodiment of the present invention, a further explanation is given taking as an example the case where an association and a region are both evaluated on the basis of a probability of an association stored in a feature library and a reference semantic model of another production system stored in a historical library, at the same time performing verification by way of field data; as shown in FIG. 14, the steps of the method may comprise:

Step 1401: acquiring a probability corresponding to an association stored in a feature library;

in a semantic model evaluation system 150 as shown in FIG. 15, a model processing apparatus 1501 acquires a probability or probabilities corresponding to one or more associations directly from at least one feature library 1502, wherein the accuracy of subsequent evaluation will be greater if the number of probabilities corresponding to associations collected in the feature library is greater. The at least one feature library 1502 stores the various associations and corresponding probabilities, which are collected in advance, in a classified manner; the classification of at least one feature library 1502 may be based on the industry to which a production system belongs, such as the motor vehicle manufacturing industry, the electronic component manufacturing industry, etc. Associations included in production systems of different types, and corresponding probabilities, are stored in different feature libraries 1502.

A probability corresponding to an association stored in a feature library may comprise: the probability of the association occurring in a production system of the same type. For example: in the case where a target production system described by a semantic model to be evaluated belongs to the motor vehicle manufacturing industry, a stored probability corresponding to an association is acquired directly from a feature library corresponding to the motor vehicle industry. Calculation of probability in this step is accomplished by calculation formula 1 above.

Furthermore, the process of determining a feature library belonging to the same type as a target production system described by a semantic model to be evaluated may be as follows: setting some key terms in advance for each feature library, and when a degree of match between terms contained in the semantic model to be evaluated and the key terms of a feature library reaches a preset match threshold, it is determined that the feature library and the target production system described by the semantic model to be evaluated belong to the same type.

Step 1402: on the basis of an acquired probability corresponding to an association in a feature library, grading associations between the various components described by a semantic model to be evaluated;

in this step, it is possible, by parsing associations between the various components described by a semantic model to be evaluated of a target production system, to determine whether the associations between the various components which are parsed out can be found in a feature library; if an association a can be found in a feature library, then on the basis of the probability of occurrence of the association a stored in the feature library, calculation formula 2 mentioned above is used to grade association a which is parsed out, i.e. a fractional value corresponding to association a is obtained; if an association b cannot be found in a feature library, then a fractional value of the association b is given directly as 0; this process thus realizes evaluation of an association between any two components described by a semantic model.

Step 1403: on the basis of a reference semantic model of at least one other production system 20 stored in a historical library, acquiring associations corresponding to at least two pairwise combinations of at least three types of component described by the reference semantic model;

the associations corresponding to at least two combinations, as mentioned in this step, may comprise: an association existing between two types of component involved in each of the at least two combinations.

In the semantic model evaluation system 150 as shown in FIG. 15, the model processing apparatus 1501 acquires feature information directly from at least one historical library 1503. The at least one historical library 1503 stores semantic models, which already exist and are collected in advance, in a classified manner; the classification of at least one historical library 1503 may be based on the industry to which a production system described by an already-existing semantic model belongs, such as the motor vehicle manufacturing industry, the electronic component manufacturing industry, etc. Semantic models of production systems of the same type are stored in the same historical library 1503; semantic models of production systems of different types are stored in different historical libraries 1503.

Furthermore, the probability corresponding to the association stored in the feature library mentioned in step 1401 may be a manner of expression of feature information; the already-existing semantic model stored in the historical library mentioned in step 1403 may also be another manner of expression of feature information.

Step 1404: on the basis of acquired associations corresponding to at least two combinations described by a reference semantic model, grading a region described by a semantic model to be evaluated;

the grading process principally consists of the following: grading the possibility that the various components in a region of a target production system described by a semantic model to be evaluated, and associations between the various components, will occur simultaneously. In the case where a region is completely present in any other production system acquired in step 1403, the region is graded jointly by way of calculation formula 3 and calculation formula 4 above; in the case where a region is not present in any other production system acquired in step 1403, and an association contained in the region can be found in a feature library, the region is graded jointly by way of calculation formula 3 and calculation formula 5 above; in the case where a region is not present in any other production system acquired in step 1403, and an association contained in the region is not present in a feature library, a grading result for the region is directly determined as 0.

Step 1405: on the basis of a result of grading corresponding to an association and a result of grading corresponding to a region, allocating corresponding initial labels for the association and the region respectively;

since the description of a semantic model comprises large numbers of components, associations between components, and regions, it is very difficult to locate a component, association or region in which an error occurs. By using different labels to present components, associations or regions which might have an error in this step, the locating of possible errors in the description of a semantic model is realized, making searching easier. For example: when a fractional value of a grading result obtained for an association or region is relatively large, it is concluded that the precision of description of the association or region by the semantic model is high, and a green label is used for marking, so the association, or components and associations in the region, are all outputted with green markers; when a fractional value of a grading result obtained for an association or region is relatively small, it is concluded that the precision of description of the association or region by the semantic model is low, and a red label is used for marking, so the association, or components and associations in the region, are all outputted with red markers, hence the user can perform confirmation for the position of the red marker(s), e.g.: if the probability of occurrence of an association obtained in step 1404 is 0, then a red label is used to mark the association and components in the association, and by determining that the association really does not exist, it is necessary to amend the semantic model. Components, and associations between components, described by an initial semantic model, can be outputted according to the label and probability, as shown in FIG. 11.

A region contains at least one association, hence when a conflict arises between a label color of a region and a label color of an association, the label color of the region is taken as the criterion.

Step 1406: acquiring field data generated in a production process executed by a target production system, and adjusting an association grading result and a region grading result by way of the field data;

the process of acquiring field data generated in a production process executed by a target production system, given in this embodiment, is performed after obtaining an initial evaluation result, but before adjusting the initial evaluation result. Furthermore, the step of acquiring field data generated in a production process executed by a target production system could also be performed before or after any one of steps 1401 to 1405.

Since field data reflects associations between the various components in a real production system, the implementation of this step principally consists of the following: data item configuration information is description information, for field data, of a semantic model to be evaluated of a target production system, and the data item configuration information binds a component described by the semantic model to be evaluated with an actual component in a production process of the target production system in advance, so that field data generated by the actual component of the target production system corresponds to the component described by the semantic model to be evaluated.

The process of implementing this step may be as follows: allocating, in advance, a corresponding fractional value for relevance between data generated by two components in an association; if the relevance between the data is the same as that of an association description, but a probability of occurrence of an association given in the abovementioned step is not the same as the fractional value, then the probability of occurrence of the association is amended to a fractional value. If a probability of occurrence of an association given in the abovementioned step is the same as the fractional value, then the probability of occurrence of the association given in the abovementioned step is retained. For example: a fractional value of 0.5 is allocated in advance for a relevance 1; the relevance is the same as an association described by a semantic model, but a probability of occurrence of an association described by a semantic model, given in the abovementioned step, is 0, so 0.5 replaces 0, to realize correction of the precision of an association described by a semantic model.

The relevance between data mentioned in this step is principally: in the case where waveforms of data generated by two components having an association such as a drive relationship or a bearing connection relationship are associated in a certain way, e.g. in the case of a drive relationship, times of generation of the data waveforms are associated, e.g. in the case of a drive relationship, the times at which peaks and troughs occur are the same.

Step 1407: on the basis of an adjusted association probability and an adjusted region probability, amending an initial label of an association and an initial label of a region;

in this step, the specific implementation process may be split into three cases:

Case 1: only a probability of an association was adjusted, so only an initial label of an association is amended;

for example: in the abovementioned step, a probability 0 of an association is adjusted to 0.5, and this 0.5 is higher than a preset precision threshold, indicating that a description of the association by a semantic model to be evaluated is accurate, so a label of the association is amended to green. In this step, it is also possible for adjusted probabilities and labels to be outputted in combination with corresponding components and associations between components described by a semantic model to be evaluated, as shown in FIG. 13.

Case 2: only a probability of a region was adjusted, so only an initial label of a region is amended;

for example: a probability 0 of a region is adjusted to 0.8, so an initial label of the region, such as red, is amended to green.

Case 3: a probability of an association and a probability of a region were adjusted at the same time, so an initial label of an association and an initial label of a region are amended at the same time;

for example: a probability 0 of an association is adjusted to 0.5, and at the same time, a probability 0 of a region is adjusted to 0.8, so a label of the association is amended to green, and an initial label of the region, such as red, is amended to green, etc.

Step 1408: an association for which the probability is less than a preset precision threshold is outputted in a table;

the association outputted in a table in this step is a disputed association or an association described inaccurately by the semantic model to be evaluated. This step may be performed directly after step 1402, or directly after step 1404, or directly after step 1406; there is no strict order of precedence with respect to the implementation of step 1407. When it is performed directly after step 1402, the association outputted in a table in this step is an association related to a grading result of step 1402; when it is performed directly after step 1404, the association outputted in a table in this step may be an association related to a grading result of step 1402 and a grading result of step 1404; when it is performed directly after step 1406, the association outputted in a table in this step is an association related to an adjusted grading result of step 1406.

By outputting an association for the user to view, a basis is provided for the user to adjust the association described by the semantic model to be evaluated.

Step 1409: on the basis of an adjusted probability of occurrence of an association, amending a probability corresponding to an association stored in a feature library;

this step principally consists of amending a probability (one type of feature information) corresponding to an association in the feature library 1502, to increase the accuracy of subsequent evaluation of a semantic model.

Step 1410: storing an adjusted semantic model to be evaluated in a historical library.

Based on the table given in step 1408 above, the user can adjust the semantic model to be evaluated, to increase the precision of description by the semantic model to be evaluated. Furthermore, by storing the adjusted semantic model to be evaluated in a historical library as feature information in this step, a reference sample can be added for subsequent evaluation of a semantic model to be evaluated, so as to further increase the accuracy of evaluation, by the model processing apparatus (1501), of a semantic model to be evaluated.

Step 1401 is an optional embodiment of step 101 shown in FIG. 1B; step 1402 and step 1404 can both serve as an optional embodiment of step 103 shown in FIG. 1B, wherein step 1402 is evaluation of an association described by a semantic model to be evaluated; step 1404 is evaluation of a region described by a semantic model to be evaluated (the region comprising at least three components and associations between components); thus, step 1402 and step 1404 may be parallel steps, or evaluation of a semantic model to be evaluated may also be realized by choosing just one thereof.

Figure 16:
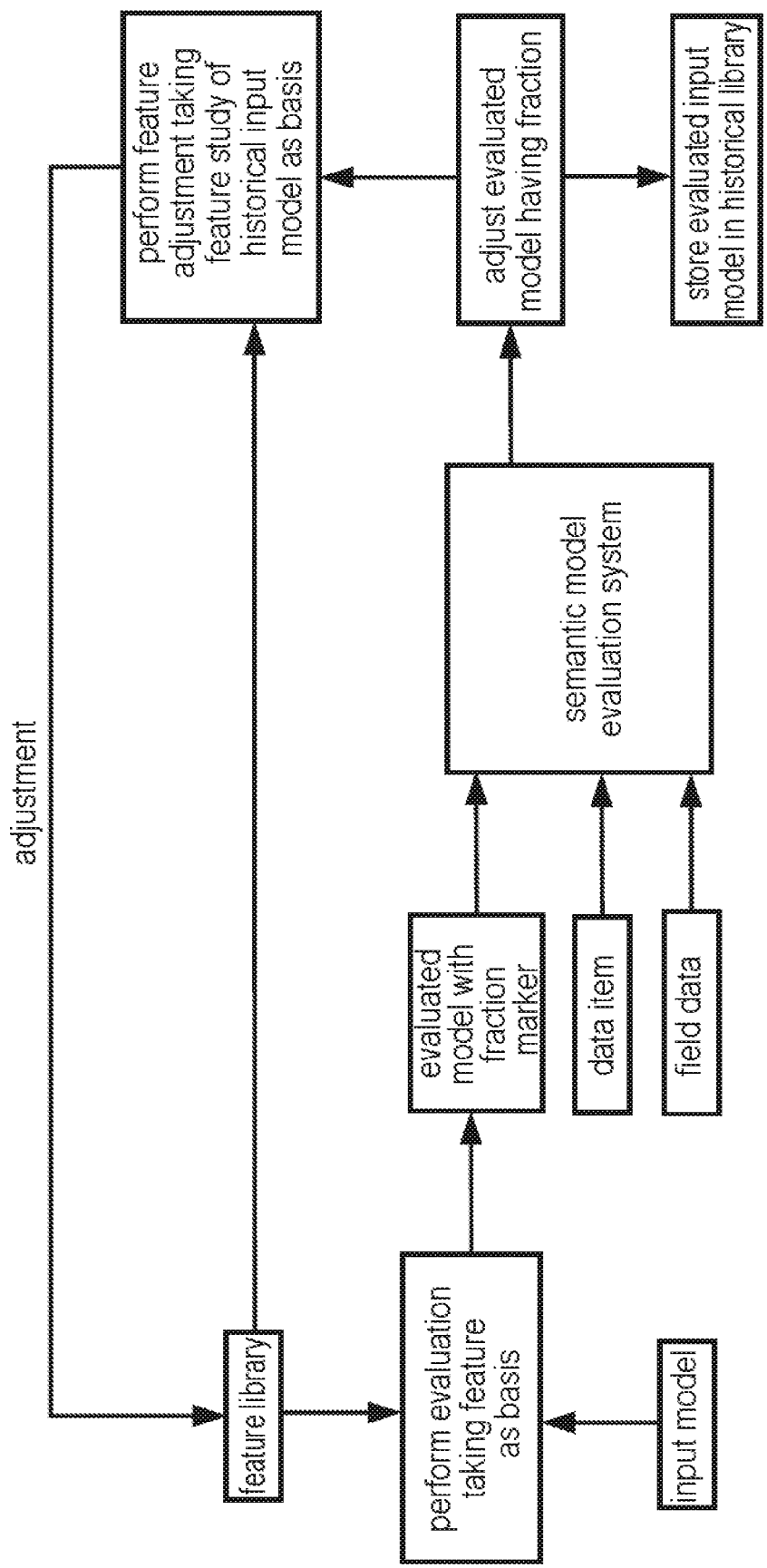
FIG. 16 is a flow chart of processing of an input model, provided in an embodiment of the present invention.

Optionally, an information processing process in a model processing process is provided in an embodiment of the present invention. Referring to FIG. 16, the information processing process comprises:

first of all, evaluation is performed using a feature as a basis, the evaluation process principally comprising: taking feature information in a feature library as a basis, evaluating an input model (the input model may be a semantic model to be evaluated of a target production system 10), and outputting an evaluated model marked with a fraction;

next, the evaluated model marked with a fraction is adjusted via a semantic model evaluation system, wherein the process of adjusting the evaluated model marked with a fraction principally consists of the following: the semantic model evaluation system adjusts the evaluated model marked with a fraction on the basis of a data item and field data, and stores the adjusted input model in a historical library;

finally, feature adjustment is performed taking feature study of a historical input model as a basis, to adjust a feature library, wherein the process of feature library adjustment principally consists of the following: performing feature study of an evaluated input model stored in a historical library, and adjusting feature information in a feature library, to realize feature library adjustment, thereby increasing the accuracy of the feature library.

Furthermore, the abovementioned model processing apparatus 1501, at least one feature library 1502 and at least one historical library 1503 may be constructed on the basis of cloud computing; on the one hand, the storage capacities of at least one feature library 1502 and at least one historical library 1503 are increased, and it is easier for at least one feature library 1502 and at least one historical library 1503 to collect feature information and already-existing semantic models, etc.; on the other hand, the evaluation of semantic models by the model processing apparatus 1501 can be made more efficient on the basis of cloud computing.

Figure 17:
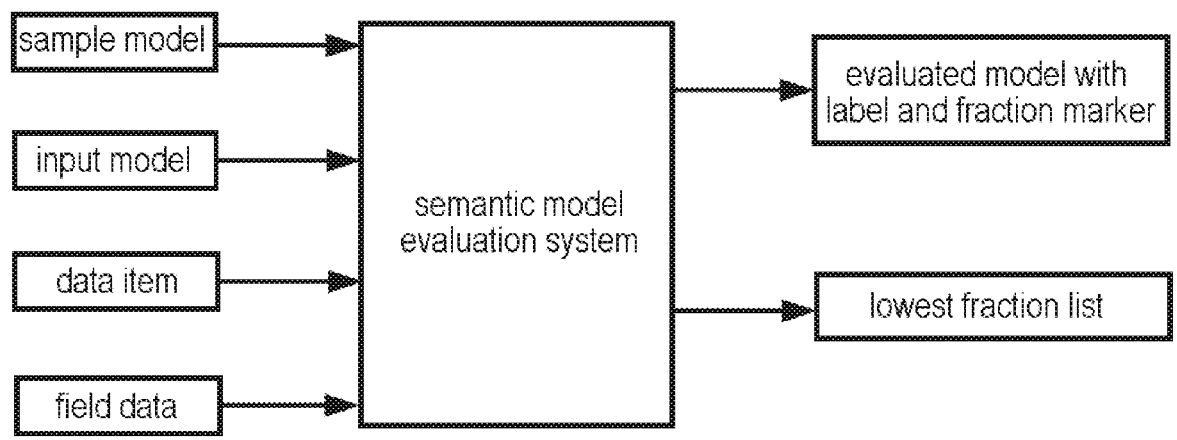
FIG. 17 is a flow chart of an evaluation process of a semantic model evaluation system provided in an embodiment of the present invention.

In summary, the process by which the semantic model evaluation system 150 shown in FIG. 15 evaluates a semantic model of a production system is as shown in FIG. 17. The semantic model evaluation system receives a sample model, an input model, a set data item and field data, and outputs an evaluated model having a label and a fraction marker, and a lowest fraction list.

Figure 18:
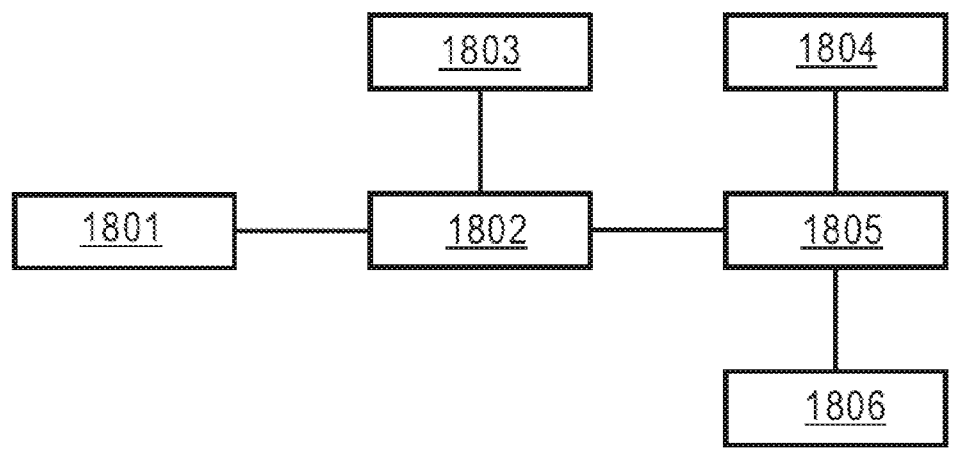
FIG. 18 is a structural schematic diagram of a model processing apparatus provided in an embodiment of the present invention.

As shown in FIG. 18, an embodiment of the present invention provides a model processing apparatus, which apparatus may be used to execute any model processing method described above, for the purpose of evaluating a semantic model to be evaluated of a target production system 10; optionally, the apparatus comprises:

a first acquisition module 1801, for acquiring feature information for describing a feature of a reference semantic model of at least one other production system 20; and an evaluation module 1802, for evaluating, on the basis of the feature information acquired by the first acquisition module 1801, the precision of the semantic model to be evaluated.

Optionally, a semantic model of a production system may be used to describe at least one of the following three items of content:

item 1: an attribute of each of at least two components included in the production system;

item 2: data generated by the at least two components; and item 3: an association between the at least two components in a production process executed by the production system.

Since a semantic model of a production system is used to describe at least one of the three items of content above, evaluation of the precision of a semantic model to be evaluated of a target production system 10 can be realized by evaluating any one or more of the three items of content above.

Figure 19:
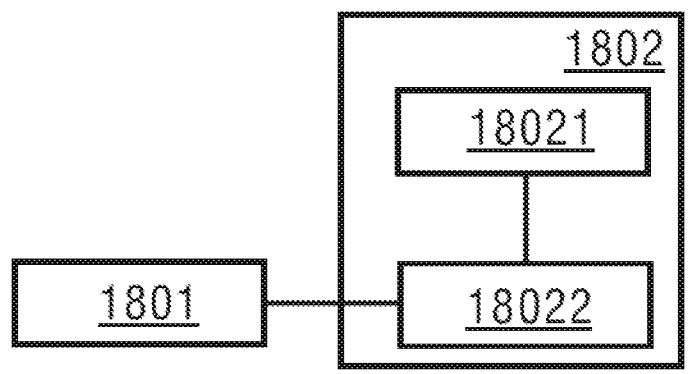
FIG. 19 is a structural schematic diagram of a model processing apparatus provided in an embodiment of the present invention.

Optionally, as shown in FIG. 19, a semantic model of a production system describes an association between at least two components included in the production system, and each other production system comprises a first type of component and a second type of component;

when acquiring the feature information, the first acquisition module 1801 is specifically used for acquiring a first probability that the first type of component and second type of component included in the at least one other production system (20) have a first association;

the evaluation module 1802 comprises: a first determination sub-module 18021 and a first evaluation sub-module 18022, wherein the first determination sub-module 18021 is used for determining, on the basis of the semantic model to be evaluated, whether the first association exists between a component belonging to the first type of component and a component belonging to the second type of component and connected to the component belonging to the first type of component in the target production system 10;

the first evaluation sub-module 18022 is used for evaluating the precision of the semantic module to be evaluated, on the basis of the first probability acquired by the first acquisition module 1801 and a first determination result of determination by the first determination sub-module 18021.

Figure 20:
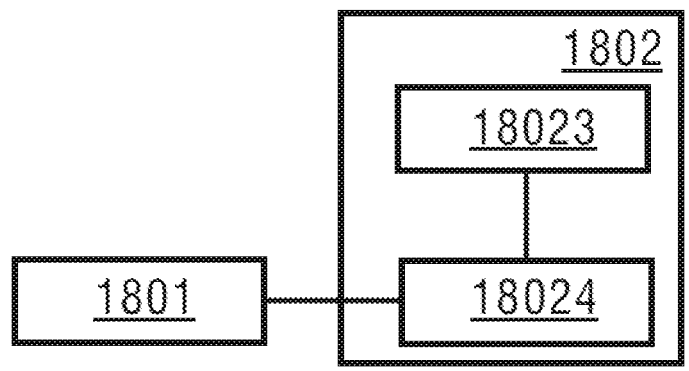
FIG. 20 is a structural schematic diagram of a model processing apparatus provided in an embodiment of the present invention.

Optionally, as shown in FIG. 20, a semantic model of a production system describes an association between at least two components included in the production system, and each other production system comprises at least three types of component;

when acquiring feature information, the first acquisition module 1801 is specifically used for acquiring a second probability that a second association exists between two types of component involved in each of at least two pairwise combinations of the at least three types of component, for the other production system 20;

the evaluation module 1802 comprises: a second determination sub-module 18023 and a second evaluation sub-module 18024, wherein the second determination sub-module 18023 is used for determining, for each of the at least two combinations, and based on the semantic model to be evaluated, whether the second association corresponding to the combination exists between each pair of connected components belonging respectively to two types of component involved in the combination in the target production system 10;

the second evaluation sub-module 18024 is used for evaluating the precision of the semantic model to be evaluated, on the basis of the second probability corresponding to each of the at least two combinations acquired by the first acquisition module 1801, and a second determination result of determination by the second determination sub-module 18023.

Optionally, a portion of or all of the at least one other production system 20 is of the same type as the target production system 10.

Optionally, the evaluation module 1802 may be used to obtain scoring information relating to the precision of the semantic model to be evaluated.

Optionally, the evaluation module 1802 may be used to obtain indication information relating to a precision rank of the semantic model to be evaluated.

Optionally, the module processing apparatus may further comprise: a list outputting module 1803, for setting out, on the basis of a result of evaluation by the evaluation module 1802, a list of a part lower than a preset semantic model precision threshold in the semantic model to be evaluated.

In another embodiment of the present invention, the module processing apparatus may further comprise: a second acquisition module 1804 and a verification module 1805, wherein the second acquisition module 1804 is used for acquiring field data generated in a production process executed by the target production system 10;

the verification module 1805 is used for verifying a result of evaluation by the evaluation module 1802 on the basis of field data acquired by the second acquisition module 1804.

Optionally, the verification module 1805 is specifically used for verifying the evaluation result on the basis of data item configuration information of the target production system 10 and the field data acquired by the second acquisition module 1804, wherein the data item configuration information is description information, for the field data, of a semantic model to be evaluated of the target production system 10.

Optionally, the module processing apparatus may further comprise: an alteration module 1806, for amending the feature information on the basis of a result of verification by the verification module 1805.

Figure 21:
FIG. 21 is a structural schematic diagram of a model processing apparatus provided in an embodiment of the present invention.

As shown in FIG. 21, an embodiment of the present invention provides a model processing apparatus, for evaluating a semantic model to be evaluated of a target production system 10, and comprising:

at least one memory 2101, for storing a semantic model evaluation program;

at least one processor 2102, for calling the semantic model evaluation program stored in the at least one memory 2101, and executing any model processing method provided in an embodiment of the present invention and described above.

Optionally, a semantic model of a production system may be used to describe at least one of the following three items of content:

item 1: an attribute of each of at least two components included in the production system 10;

item 2: data generated by the at least two components;

item 3: an association between the at least two components in a production process executed by the production system 10.

Embodiments of the present invention are also directed to a machine-readable medium, in which are stored instructions for causing a machine to execute a model processing method as provided in an embodiment of the present invention. Specifically, a system or apparatus equipped with a storage medium may be provided; software program code realizing functions of any one of the embodiments above is stored on the storage medium, and a device (or CPU or MPU) of the system or apparatus is caused to read and execute program code stored in the storage medium.

In such a situation, program code read from a storage medium can itself realize functions of any one of the embodiments above, hence the program code and the storage medium storing the program code form part of embodiments of the present invention.

Examples of storage media used for providing program code include floppy disks, hard disks, magneto-optical disks, optical disks (such as CD-ROM, CD-R, CD-RW, DVD-ROM, DVD-RAM, DVD-RW, DVD+RW), magnetic tapes, non-volatile memory cards and ROM. Optionally, program code may be downloaded from a server computer via a communication network.

Furthermore, it should be clear that an operating system operating on a computer can be made to complete a portion of or all actual operations, not only through execution of program code read by a computer, but also by way of instructions based on program code, so as to realize functions of any one of the embodiments above.

In addition, it can be appreciated that program code read out from the storage medium is written into a memory installed in an expansion board inserted in the computer, or written into a memory installed in an expansion unit connected to the computer, and thereafter instructions based on the program code make a CPU etc. installed on the expansion board or expansion unit execute part or all of an actual operation, so as to realize the function of any one of the embodiments above.

It must be explained that not all of the steps and modules in the flows and system structure diagrams above are necessary; certain steps or modules may be omitted according to actual requirements. The order in which steps are executed is not fixed, but may be adjusted as required. The system structures described in the embodiments above may be physical structures, and may also be logical structures, i.e. some modules might be realized by the same physical entity, or some modules might be realized by multiple physical entities, or realized jointly by certain components in multiple independent devices.

In the embodiments above, a hardware unit may be realized in a mechanical or an electrical manner. For example, a hardware unit may comprise a permanent dedicated circuit or logic (e.g. a special processor, FPGA or ASIC) to complete a corresponding operation. A hardware unit may also comprise programmable logic or circuitry (e.g. a universal processor or another programmable processor), and may be set temporarily by software to complete a corresponding operation. Particular embodiments (mechanical, or dedicated permanent circuitry, or temporarily set circuitry) may be determined on the basis of considerations of cost and time.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The present invention has been displayed and explained in detail above by way of the accompanying drawings and preferred embodiments, but the present invention is not limited to these disclosed embodiments. Based on the embodiments described above, those skilled in the art will know that further embodiments of the present invention, also falling within the scope of protection of the present invention, could be obtained by combining code checking means in different embodiments above.

The invention claimed is:

1. A model processing method, for evaluating a semantic model to be evaluated of a target production system, the semantic model to be evaluated being a first semantic model, the model processing method comprising:

acquiring feature information for describing a feature of a reference semantic model of at least one other production system, the reference semantic model being a second semantic model;

evaluating, based upon the feature information acquired, precision of the semantic model to be evaluated;

acquiring field data generated in a field, the field being a production process executed by the target production system;

after the evaluating the precision of the semantic model, verifying a result of the evaluating based upon the field data acquired in the field and upon data item configuration information of the target production, wherein the data item configuration information is description information, for the field data acquired, of the semantic model of the target production system to be evaluated; and amending the feature information based upon a result of the verifying, wherein the target production system comprises at least one of an electric machine, a gearbox, a vibration sensor and a friction wheel, and the semantic model to be evaluated comprises at least one of a first relationship between the electric machine and the vibration sensor, a second relationship between the electric machine and the gearbox, and a third relationship between the gearbox and the friction wheel, the semantic model to be evaluated describes an association between at least two components included in the target production system, the at least one other production system comprising a first type of component and a second type of component, the first type and the second type selected from a group, the group including a second electric machine, second gearbox, a second vibration sensor or second friction wheel, wherein the acquired feature information includes a first probability that the first type of component and the second type of component have a first association, the at least one other production system comprises at least three types of components, the at least three types selected from the group, the acquired feature information comprises a second probability, for the at least one other production system, that a second association exists between two types of components involved in each of at least two pairwise combinations of the at least three types of component, and wherein the evaluating includes, determining, based upon the semantic model to be evaluated, whether the first association exists between a component belonging to the first type of component and a component belonging to the second type of component and connected to the component belonging to the first type of component in the target production system, as a first determination result, evaluating, based upon the first probability and the first determination result, the precision of the semantic model to be evaluated, for each of the at least two combinations, and based upon the semantic model to be evaluated, determining whether the second association corresponding to the at least two combinations exists between each pair of connected components belonging respectively to the two types of components involved in the at least two combinations in the target production system, as a second determination result, the two types selected from the group, based upon the second probability corresponding to each of the at least two combinations, and the second determination result, evaluating the precision of the semantic model to be evaluated, and at least one of,
(A) obtaining scoring information relating to the precision of the semantic model to be evaluated, and
(B) obtaining indication information relating to a precision rank of the semantic model to be evaluated.

2. The method of claim 1, wherein a portion of or all of the at least one other production system is of a same type as the target production system, the same type selected from the group.

3. The method of claim 1, further comprising, after the evaluating, based upon the feature information acquired, the precision of the semantic model to be evaluated:

based upon a result of the evaluating, setting out a list of a part relatively lower than a semantic model precision threshold in the semantic model to be evaluated.

4. A model processing apparatus, for evaluating a semantic model to be evaluated of a target production system, the semantic model to be evaluated being a first semantic model, the model processing apparatus comprising:

a processor configured to execute machine-readable instructions, that when executed, cause the model processing apparatus to acquire feature information for describing a feature of a reference semantic model of at least one other production system, the reference semantic model being a second semantic model, evaluate, based upon the feature information acquired by the model processing apparatus, precision of the semantic model to be evaluated, acquiring field data generated in a field, the field being a production process executed by the target production system;

after the evaluating the precision of the semantic model, verifying a result of the evaluating based upon the field data acquired in the field and upon data item configuration information of the target production, wherein the data item configuration information is description information, for the field data acquired, of the semantic model of the target production system to be evaluated; and amending the feature information based upon a result of the verifying, wherein the target production system comprises at least one of an electric machine, a gearbox, a vibration sensor and a friction wheel, and the semantic model to be evaluated comprises at least one of a first relationship between the electric machine and the vibration sensor, a second relationship between the electric machine and the gearbox, and a third relationship between the gearbox and the friction wheel, wherein the semantic model to be evaluated describes an association between at least two components included in the production system, and wherein the processor, when acquiring the feature information, is configured to cause the model processing apparatus to acquire a first probability that a first type of component and a second type of component included in the at least one other production system have a first association, the first and second type selected from a group, the group including a second electric machine, a second gearbox, second vibration sensor or a second friction wheel, the processor, when acquiring the feature information, is used to acquire a second probability, for the at least one other production system, that a second association exists between two types of component involved in each of at least two pairwise combinations of at least three types of component, the types of components selected from the group, the processor is further configured to cause the model processing apparatus to, determine, based upon the semantic model to be evaluated, whether the first association exists between a component belonging to the first type of component and a component belonging to the second type of component and connected to the component belonging to the first type of component in the target production system, evaluate the precision of the semantic model to be evaluated, based upon the first probability acquired by the processor and a first determination result of determination by the processor, determine, for each of the at least two combinations, and based on the semantic model to be evaluated, whether the second association corresponding to the at least two combinations exists between each pair of connected components belonging respectively to two types of component involved in the at least two combinations in the target production system, evaluate the precision of the semantic model to be evaluated, based upon the second probability corresponding to each of the at least two combinations acquired by the processor, and a second determination result of determination by the processor, and at least one of (A) obtain scoring information relating to the precision of the semantic model to be evaluated, and (B) obtain indication information relating to a precision rank of the semantic model to be evaluated.

5. The model processing apparatus of claim 4, wherein the processor is further configured to set out, based upon a result of evaluation by the processor, a list of a part relatively lower than a semantic model precision threshold in the semantic model to be evaluated.

6. A model processing apparatus, for evaluating a semantic model to be evaluated of a target production system, the semantic model to be evaluated being a first semantic model, the model processing apparatus comprising:

at least one memory, to store a semantic model evaluation program; and at least one processor, to call the semantic model evaluation program stored in the at least one memory, and execute at least acquiring feature information for describing a feature of a reference semantic model of at least one other production system, the reference semantic model being a second semantic model, evaluating, based upon the feature information acquired, precision of the semantic model to be evaluated, acquiring field data generated in a field, the field being a production process executed by the target production system;

after the evaluating the precision of the semantic model, verifying a result of the evaluating based upon the field data acquired in the field and upon data item configuration information of the target production, wherein the data item configuration information is description information, for the field data acquired, of the semantic model of the target production system to be evaluated; and amending the feature information based upon a result of the verifying, wherein the target production system comprises at least one of an electric machine, a gearbox, a vibration sensor and a friction wheel, and the semantic model to be evaluated comprises at least one of a first relationship between the electric machine and the vibration sensor, a second relationship between the electric machine and the gearbox, and a third relationship between the gearbox and the friction wheel, wherein the semantic model to be evaluated describes an association between at least two components included in the target production system, the at least one other production system comprising a first type of component and a second type of component, the first type and the second type selected from a group, the group including a second electric machine, a second gearbox, a second vibration sensor or a second friction wheel, wherein the acquired feature information includes a first probability that the first type of component and the second type of component have a first association, the at least one other production system comprises at least three types of component, the at least three types selected from the group, wherein the acquired feature information comprises a second probability, for the at least one other production system, that a second association exists between two types of component involved in each of at least two pairwise combinations of the at least three types of component, and wherein the evaluating includes, determining, based upon the semantic model to be evaluated, whether the first association exists between a component belonging to the first type of component and a component belonging to the second type of component and connected to the component belonging to the first type of component in the target production system, as a first determination result, evaluating, based upon the first probability and the first determination result, the precision of the semantic model to be evaluated, for each of the at least two combinations, and based upon the semantic model to be evaluated, determining whether the second association corresponding to the combination exists between each pair of connected components belonging respectively to the two types of components involved in the combination in the target production system, as a second determination result, the two types selected from the group, based upon the second probability corresponding to each of the at least two combinations, and the second determination result, evaluating the precision of the semantic model to be evaluated, and at least one of, (A) obtaining scoring information relating to the precision of the semantic model to be evaluated, and (B) obtaining indication information relating to a precision rank of the semantic model to be evaluated.

7. A non-transitory machine-readable medium, including a machine-readable instruction stored on the machine-readable medium, the machine-readable instruction, when executed by a processor, being configured to cause the processor to execute the method of claim 1.

8. The model processing apparatus of claim 4, wherein the processor is configured to cause the model processing apparatus to set out, based upon a result of evaluating, a list of a part relatively lower than a semantic model precision threshold in the semantic model to be evaluated.

\* \* \* \* \*